(12) United States Patent
Haridass et al.

(10) Patent No.: US 7,835,453 B2
(45) Date of Patent: *Nov. 16, 2010

(54) DIFFERENTIAL TRANSMITTER CIRCUIT

(75) Inventors: Anand Haridass, Austin, TX (US); Bao G. Truong, Austin, TX (US); Joel D. Ziegelbein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/350,120

(22) Filed: Jan. 7, 2009

(65) Prior Publication Data

US 2009/0113107 A1    Apr. 30, 2009

Related U.S. Application Data

(63) Continuation of application No. 11/086,718, filed on Mar. 22, 2005, now Pat. No. 7,512,183.

(51) Int. Cl.
   *H04B 3/00* (2006.01)
(52) U.S. Cl. .................................................. 375/257
(58) Field of Classification Search ................ 375/257, 375/296, 259, 297, 302, 312
   See application file for complete search history.

(56) References Cited

U.S. PATENT DOCUMENTS

| | | | | |
|---|---|---|---|---|
| 6,647,072 | B1 * | 11/2003 | Shibamura | 375/297 |
| 7,242,249 | B2 * | 7/2007 | Dreps et al. | 330/254 |
| 7,512,183 | B2 * | 3/2009 | Haridass et al. | 375/257 |
| 2001/0024477 | A1 * | 9/2001 | Haycock | 375/296 |
| 2006/0181348 | A1 | 8/2006 | Dreps et al. | 330/254 |

* cited by examiner

*Primary Examiner*—Kevin M Burd
(74) *Attorney, Agent, or Firm*—Matthew W. Baca; Winstead Sechrest & Minick P.C.

(57) ABSTRACT

A driver circuit is configured as a frequency compensated differential amplifier having one input coupled to a first data signal and a second input coupled to a second data signal. Each stage of the differential amplifier is biased with a current source. The driver circuit generates a first output signal coupled to the input of a first transmission line and a second output signal coupled to the input of a second transmission line. The first and second output signals are generated as the difference between the first and second data signals amplified by a compensated gain. A compensation network that attenuates the low frequency components of the input signals relative to the high frequency components is coupled between current sources biasing the differential amplifier. The outputs of the first and second transmission lines are coupled to the inputs of a differential receiver that may or may not be frequency compensated.

2 Claims, 6 Drawing Sheets

DIFFERENTIAL TRANSMITTER CIRCUIT

CROSS REFERENCE TO RELATED APPLICATIONS

The present application is a continuation application of pending U.S. patent application Ser. No. 11/086,718, which was filed on Mar. 22, 2005, which is assigned to the assignee of the present invention. The present application claims priority benefits to U.S. patent application Ser. No. 11/086,718.

TECHNICAL FIELD

The present invention relates in general to board level transmission line drivers and receivers, and in particular, to transmitter circuits for driving transmission lines coupling elements on circuit boards.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (crosstalk) affects signal quality. One way to alleviate the detrimental effects of noise and coupling is through the use of differential signaling. Differential signaling comprises sending a signal and its complement to a differential receiver. In signaling comprises sending a signal and its complement to a differential receiver. In this manner, noise and coupling affect both the signal and the complement equally. The differential receiver only senses the difference between the signal and its complement as the noise and coupling represent common mode signals. Therefore, differential signaling is resistant to the effects that noise and crosstalk have on signal quality.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. For differential signaling, parallel transmission lines are used. Each transmission line may be terminated with respect to their individual characteristic impedance or the differential pair may be terminated with a resistance between the two transmission lines equal to the differential line impedance.

As the frequency of the data and clock signals increase, the amount of skew between the data signals and the clock signal in a clock group becomes important. The delay of the transmission path may be several clock cycles. To accurately detect data and to align all of the data signals before sending to core logic in a receiving chip, the data signals are delayed relative to the clock until an optimum sampling time is achieved. This is ideally in the middle of the eye window of the data signals. Since the data signals are sampled with a clock, the amount of delay in the delay line in the data paths is relative to the clock signal. If environmental factors cause the delay of the delay line to vary, then accurately sampling the clock may be compromised or may cause errors.

Signal quality may be increased by compensating for high frequency losses. It is well known that any repetitive signal or pattern may be decomposed in to its various Fourier frequency components. Such a decomposition of a generated signal and a signal received over a transmission line would show that high frequency content is attenuated more than lower frequency content. To compensate for these effects, one may decrease the low frequency content, boost the high frequency content or do both. Frequency compensation may be incorporated at the source or driver side, within the transmission network, at the receiver side, or both. Simply boosting the high frequency content above a non compensated level may also increase the high frequency noise.

There is, therefore, a need for circuitry implementing driver side controllable high frequency compensation for use with a differential receiver to improve the data eye pattern on the receiver side using a standard or a frequency compensated differential receiver.

SUMMARY OF THE INVENTION

Differential amplifier stages may be configured as common source FET stages or common emitter bipolar stages. As the current in each half of the differential stage is varied in response to an input signal, a corresponding voltage change is generated across a load resistor in series with each drain or collector that sets the source resistance of the outputs. The differential stages are normally biased with a circuit that approximates an ideal current source having a current value I. If the two FET devices making up the differential stage are matched, then each stage will conduct current I/2 with equal input voltages as the current source voltage adjusts to force both devices to have the same gate to source voltage (VGS) and thus the same drain current. When the differential input voltage changes, then one-half of the change appears as an increase to one VGS and the other half appears as a decrease in the other VGS. This causes one drain current to increase and the other to decrease by the same amount while the total current remains equal to current I of the current source. A resistance R is added between the source terminals of the two FET devices to modify the gain of the differential stage. Now, when the differential input voltage changes, part of the change appears as changes in the VGS values as discussed and part appears as voltages across the resistance R. Only the variation in VGS changes the corresponding drain currents and thus the output voltages, therefore, the effect of adding resistance R to the source circuit is to reduce the overall gain of the amplifier stage.

The differential amplifier stage is used to configure a differential driver to apply a differential signal to transmission lines wherein the gain of the differential amplifier is configured to be frequency dependent using a frequency compensation network. The frequency compensation network comprises a resistor coupled in parallel with a capacitor. The current source for the differential driver is partitioned into two equal current sources one coupled to bias the first half (stage) of the differential driver and the other coupled to bias the second stage of the differential driver. The frequency compensation network is coupled between the current source nodes of the two differential stages. The resistor operates to reduce the gain for low frequency components of the drive signal and the capacitor operates to set the gain of the high frequency components at the nominal amplifier gain value. In this manner, the low frequency components are attenuated and the high frequency components are not amplified over their non-compensated levels to maintain the high frequency noise levels. The differential driver enhances the data eye pattern of a signal generated by the frequency compensated differential driver when it is received in a differential receiver. The differential receiver may or may not be correspondingly frequency compensated wherein low frequency signal components are attenuated relative to high frequency signal components.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 1:
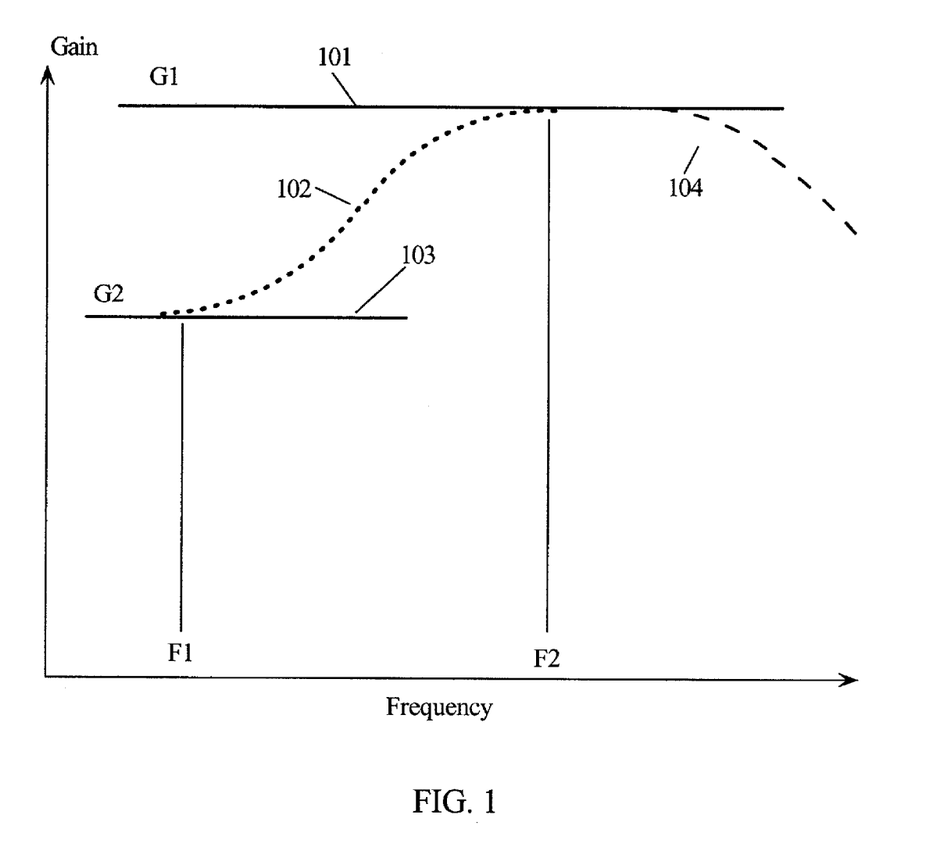
FIG. 1 illustrates three frequency response curves corresponding to a nominal frequency response, an attenuated response and a response that transitions between the nominal and attenuate with increasing frequency.

FIG. 1 illustrates three frequency response curves plotting gain as a function of frequency for a differential driver according to embodiments of the present invention. Gain 101 is the maximum gain of the differential driver when the frequency compensation network (RLF 310 and CHF 311 in FIG. 3A) does not add significant attenuation. Curve 104 is the natural roll-off of the devices making up the differential driver stages (e.g., NFETs 307 and 309). Gain 103 is the minimum gain attributed to attenuation by the compensation network. Curve 102 is the composite gain of the differential driver from frequencies less than F2 to frequencies above F1 according to embodiments of the present invention.

Figure 2:
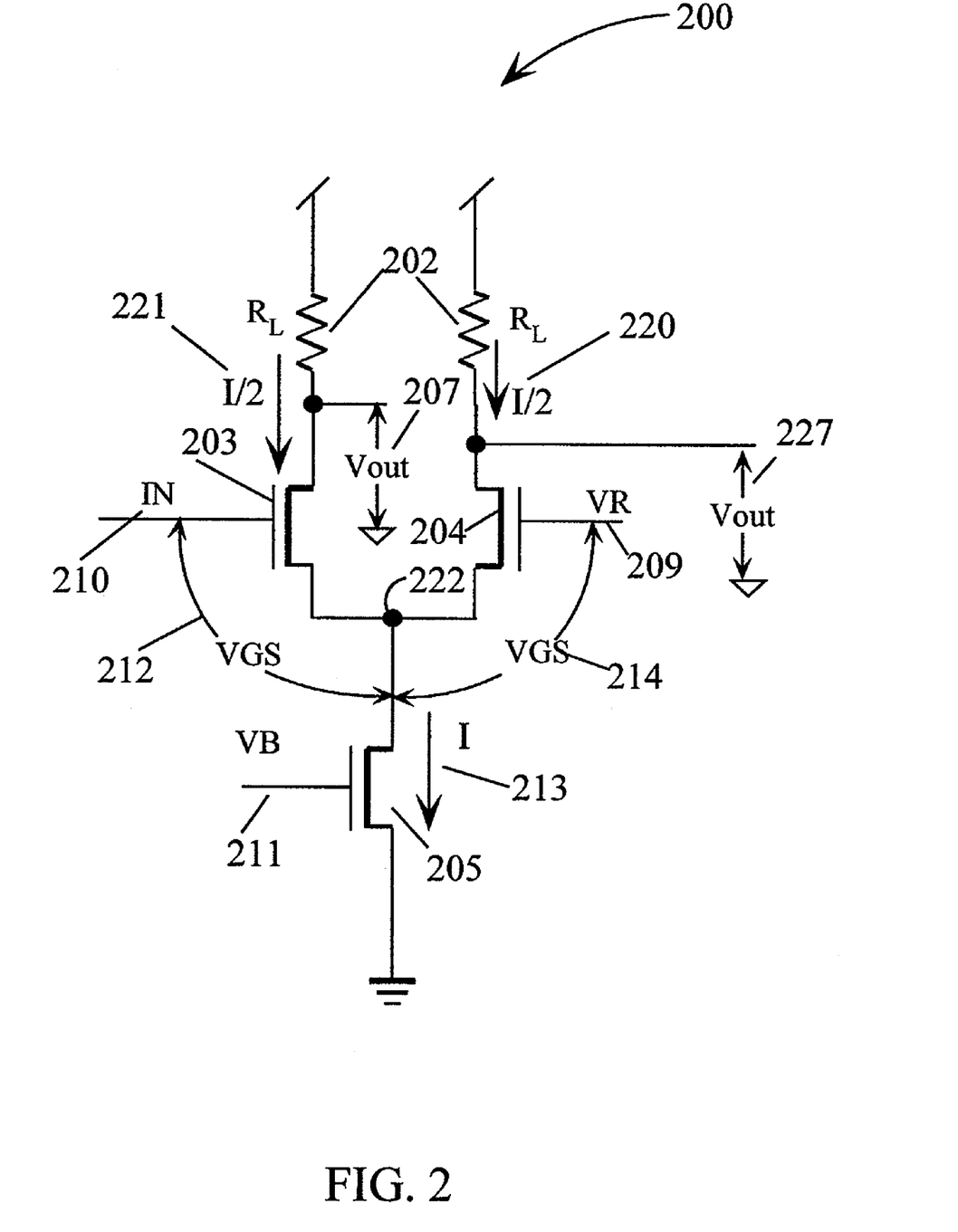
FIG. 2 is a standard common source FET current source biased differential amplifier.

FIG. 2 is a circuit diagram of a differential stage 200 for amplifying the difference between an input IN 210 and a reference voltage VR 209 and generating output Vout 207 across a load resistor 202. The differential stage 200 is biased with a current source comprising NFET 205. When a bias voltage VB 211 is applied to the gate of NFET 205, the resulting drain current 213 is relatively constant and independent of the voltage on node 222. The current 213 divides between NFET 203 and 204 based on the difference between the gate-to source voltages VGS 212 and VGS 214. If input 210 and Vref 209 are equal, then currents 220 and 221 are equal and their sum is equal to current 213. It may be shown that the voltage gain of each output of differential stage 200 is dependent on the load resistor RL 202 and the dynamic impedance of the NFETS 203 and 204. The dynamic impedance of the NFETS 203 and 204 are a function of their corresponding bias currents 221 and 222 respectively. Therefore, the stage gain may be varied by varying the total bias current 213 which in turn varies bias currents 221 and 222. Vout 207 and Vout 227 produce complementary signals as the amplified difference between IN 210 and VR 209.

Figure 3A:
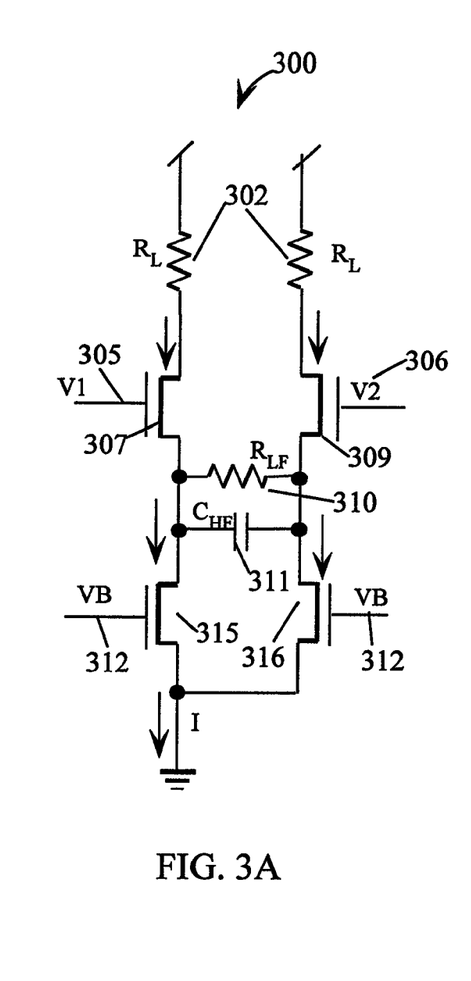
FIG. 3A is a frequency compensated differential amplifier.
Figure 3B:
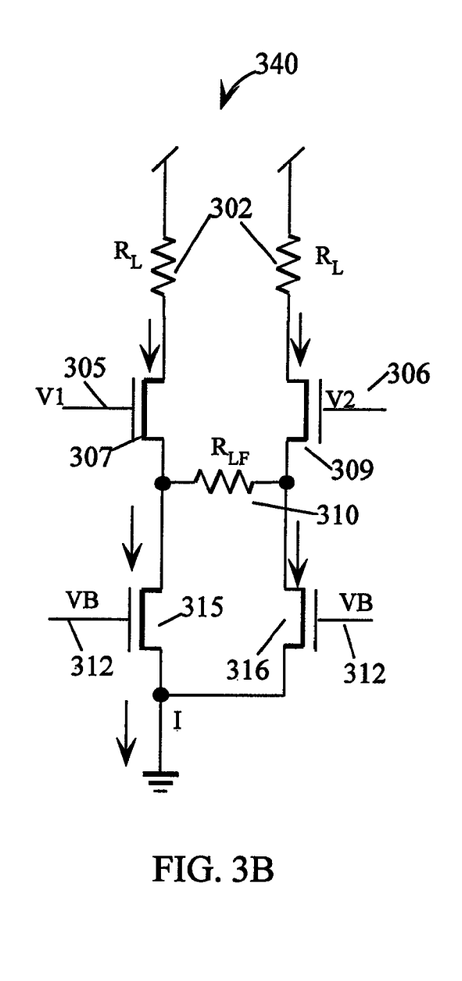
FIG. 3B is an equivalent circuit for the differential amplifier of FIG. 3A at low frequencies.

FIG. 3B is a circuit diagram of a differential amplifier 340 comprising NFETS 307 and 309 with corresponding equal load resistors RL 302. NFETS 307 and 309 are biased with independent current sources, NFET 315 and 316. The two current sources are coupled with resistor RLF 310. Using a common voltage level for VB 312 sets NFET 307 and NFET 309 to conduct the same current when V1 305 and V2 306 are equal. Without resistor RLF 310, the two halves of the differential amplifier 340 would be independent. The magnitude of RLF 310 determines the gain by which each half of amplifier 340 amplifies the difference between V1 305 and V2 306. The gain response of differential amplifier 340 corresponds to curve 103 in FIG. 1.

Figure 3C:
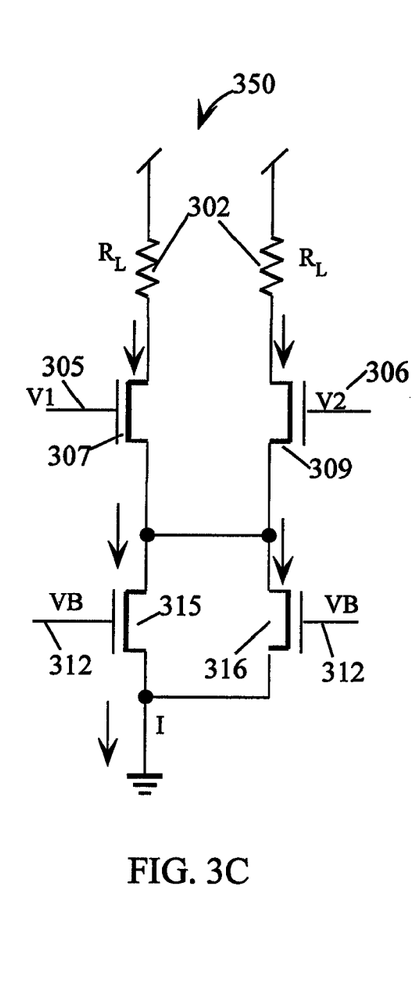
FIG. 3C is an equivalent circuit for the differential amplifier of FIG. 3A at high frequencies.

FIG. 3C is a circuit diagram of the differential amplifier 350 comprising NFETS 307 and 309 with corresponding equal load resistors RL 302. NFETS 307 and 309 are biased with independent current sources NFET 315 and 316. The two current sources are directly coupled such that they operate as one current source. Again, using a common VB 312, both current sources NFET 307 and NFET 309 are biased at the same current. This configuration is like FIG. 2, except the current source comprises two FETS 315 and 316. The response of differential amplifier 350 corresponds to curve 101 in FIG. 1.

FIG. 3A is a circuit diagram of differential amplifier 300 wherein the features of differential amplifiers 350 and 340 are incorporated into one differential amplifier except the direct coupling between the sources of NFETS 307 and 309, in differential amplifier 350 is replaced with a capacitance CHF 311. In this configuration, the differential amplifier 300 has a frequency response curve that corresponds to curve 103 at low frequencies wherein the impedance of CHF 311 is much greater than RLF 310. Likewise, at high frequencies, the impedance of CHF 311 is much smaller than RLF 310 and the combined circuit has a frequency response curve that corresponds to curve 101. Between these extremes, the frequency response curve follows curve 102. By suppressing the low frequency gain with resistor RLF 310 and bypassing RLF 310 with capacitor CHF 311, a peaking frequency response is realized. The differential amplifier 300 allows the difference between V1 305 and V2 306 with the high frequency signal components being amplified with a gain greater than low frequency signal components. However, the high frequency gain of differential amplifier 300 is not greater than differential amplifier 350; rather, the low frequency gain of differential amplifier 300 is reduced from the low frequency gain of differential amplifier 350. In this manner, the high frequency noise of differential amplifier 300 is substantially the same as differential amplifier 350. Bias voltage Vbias 312 may be varied to vary the overall gain of differential amplifier 300 while maintaining a difference between the low frequency and high frequency gains.

Figure 4:
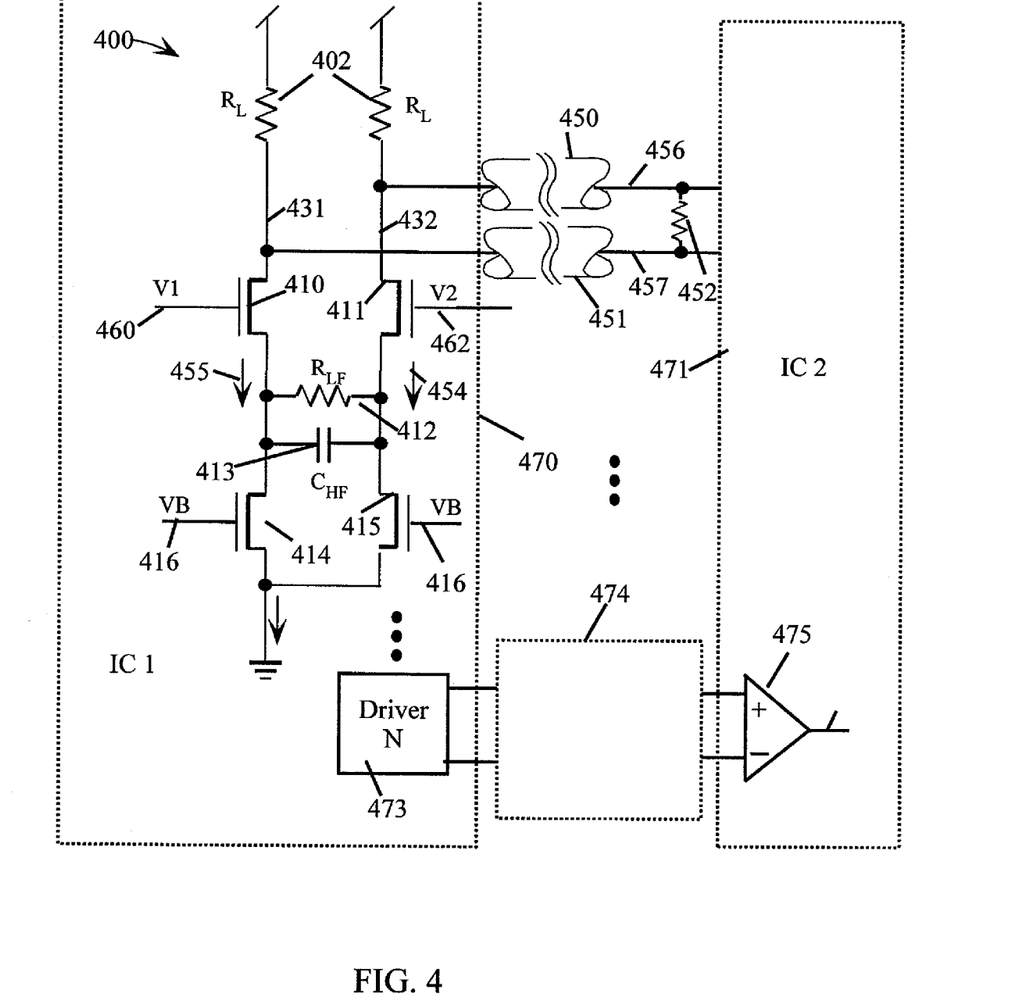
FIG. 4 is a frequency compensated driver according to embodiments of the present invention.

FIG. 4 is a circuit diagram of a differential driver 400 according to an embodiment of the present invention. Differential driver 400 is similar to differential amplifier 300 and is contained in IC 1 470. V1 460 is coupled to a data signal and V2 462 may be coupled to a reference voltage or to a complement of the data signal at V1 460. Current source NFETS 414 and 415 generate equal currents 455 and 454 in response to equal bias voltages VB 416 applied to each gate terminal. Input signals at V1 460 and V2 462 are amplified with response curves as shown in FIG. 1. The compensation network comprising resistor RLF 412 and capacitor CHF 413 causes the low frequency components of the input signals to be amplified with a lower gain relative to high frequency components. Differential driver signals are developed across equal load resistors RL 402 at output nodes 431 and 432. Since the drain currents of NFETS 410 and 411 are relatively independent of the drain voltage (nodes 431 and 432), the dynamic source resistance of nodes 431 and 432 is essentially equal to the value of resistor RL 402.

Node 432 is coupled to a transmission line 450 which couples the output signal at node 432 to the positive input of differential receiver 453. Likewise, node 431 is coupled to a transmission line 451 which couples the output signal at node 431 to the negative input of differential receiver 453. Transmission lines 450 and 451 are the interconnection network that connect IC 1 470 to IC2 471. Differential receiver 453 (in IC2 471) may be frequency compensated like differential amplifier 300 or may have an un-compensated frequency response like differential amplifier 350. Differential receiver 453 generates a detected output 472 as the amplified difference between the signals at nodes 456 and 457. The output signals generated at nodes 431 and 432 are complementary signals representing logic levels with opposite, coincident state transitions. Transmission lines (TL) 450 and 451 each have a characteristic impedance Z0 relative to their ground return path. Conductors 456 and 457 are shown coupled with a differential termination 452 which may or may not be contained in IC2 471. However, each transmission line 450 and 451 may be separately terminated. High frequency components are predominate in the state transitions and are amplified in preference to lower frequency components which tend to represent variations in the logic one and logic zero voltage levels and any signals causing non-monotonic logic state transitions. As the output signals propagate through TL 450 and TL 451, they undergo losses which attenuate high frequency components more than low frequency components. However, by pre-emphasizing the high frequency components relative to the low frequency components, the high frequency component levels relative to low frequency component levels are restored thereby improving the data eye pattern of the signals at the input of receiver 453.

Driver 400 is one of a multiplicity of drivers 400-473 used to couple signals from IC1 470 to receiver IC2 471 having a multiplicity of receivers 453-475. Each signal is communicated on a path or channel comprising transmission lines 450-474.

In one embodiment of the present invention, differential receiver 453 is frequency compensated like differential amplifier 300 in FIG. 3A. In another embodiment of the present invention, differential receiver 453 is not frequency compensated.

Figure 5:
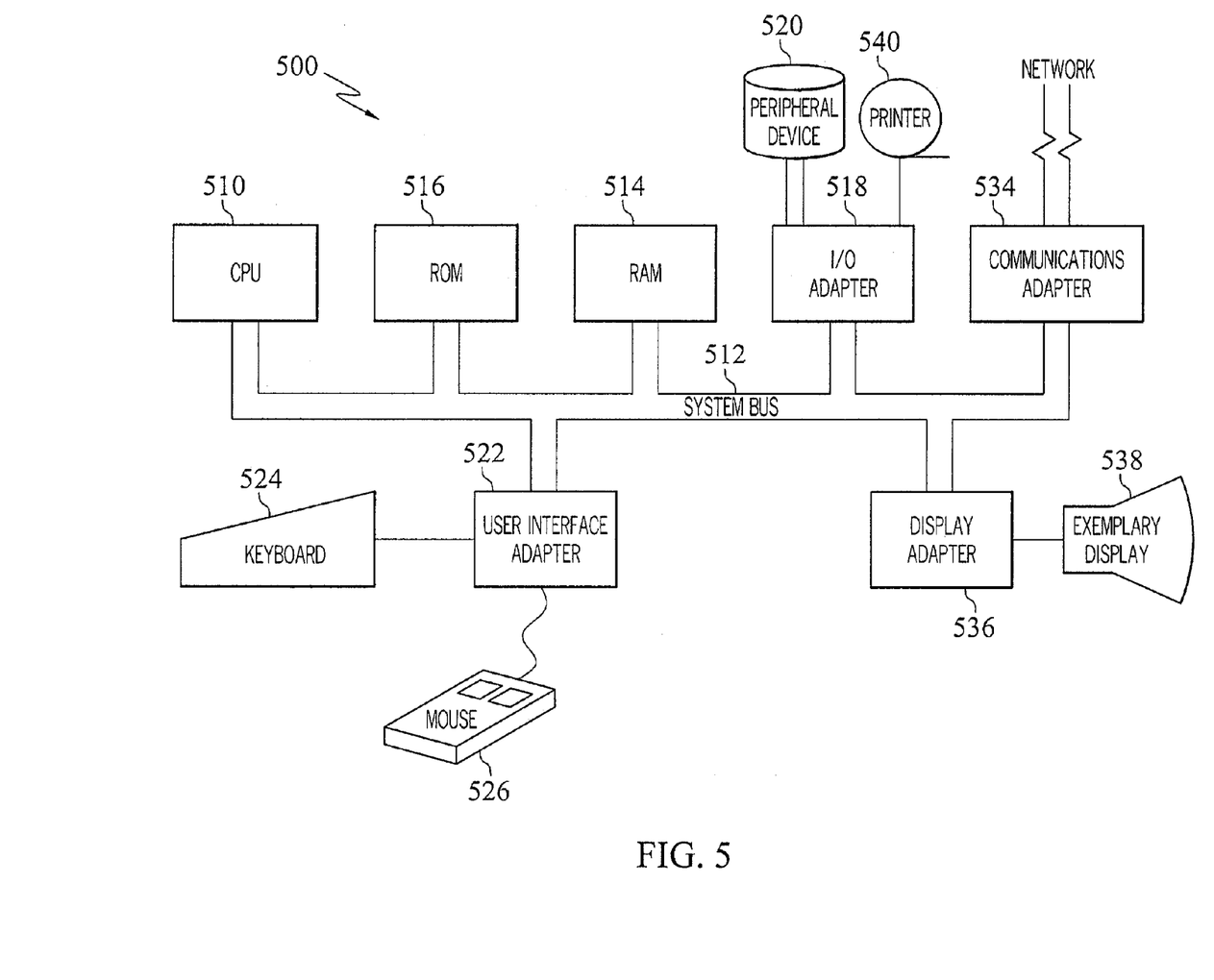
FIG. 5 is a block diagram of a data processing system suitable for practicing embodiments of the present invention.

FIG. 5 is a high level functional block diagram of a representative data processing system 500 suitable for practicing the principles of the present invention. Data processing system 500 includes a central processing system (CPU) 510 operating in conjunction with a system bus 512. System bus 512 operates in accordance with a standard bus protocol, such as the ISA protocol, compatible with CPU 510. CPU 510 operates in conjunction with electronically erasable programmable read-only memory (EEPROM) 516 and random access memory (RAM) 514. Among other things, EEPROM 516 supports storage of the Basic Input Output System (BIOS) data and recovery code. RAM 514 includes, DRAM (Dynamic Random Access Memory) system memory and SRAM (Static Random Access Memory) external cache. I/O Adapter 518 allows for an interconnection between the devices on system bus 512 and external peripherals, such as mass storage devices (e.g., a hard drive, floppy drive or CD/ROM drive), or a printer 540. A peripheral device 520 is, for example, coupled to a peripheral control interface (PCI) bus, and I/O adapter 518 therefore may be a PCI bus bridge. User interface adapter 522 couples various user input devices, such as a keyboard 524 or mouse 526 to the processing devices on bus 512. Exemplary display 538 may be a cathode ray tube (CRT), liquid crystal display (LCD) or similar conventional display units. Display adapter 536 may include, among other things, a conventional display controller and frame buffer memory. Data processing system 500 may be selectively coupled to a computer or telecommunications network 541 through communications adapter 534. Communications adapter 534 may include, for example, a modem for connection to a telecom network and/or hardware and software for connecting to a computer network such as a local area network (LAN) or a wide area network (WAN). CPU 510 and other components of data processing system 500 may contain logic circuitry in two or more integrated circuit chips that are separated by a significant distance relative to their communication frequency such that differential signaling is used to improve reliability. The drivers may employ frequency compensation to improve communication signal detection according to embodiments of the present invention.

Figure 6:
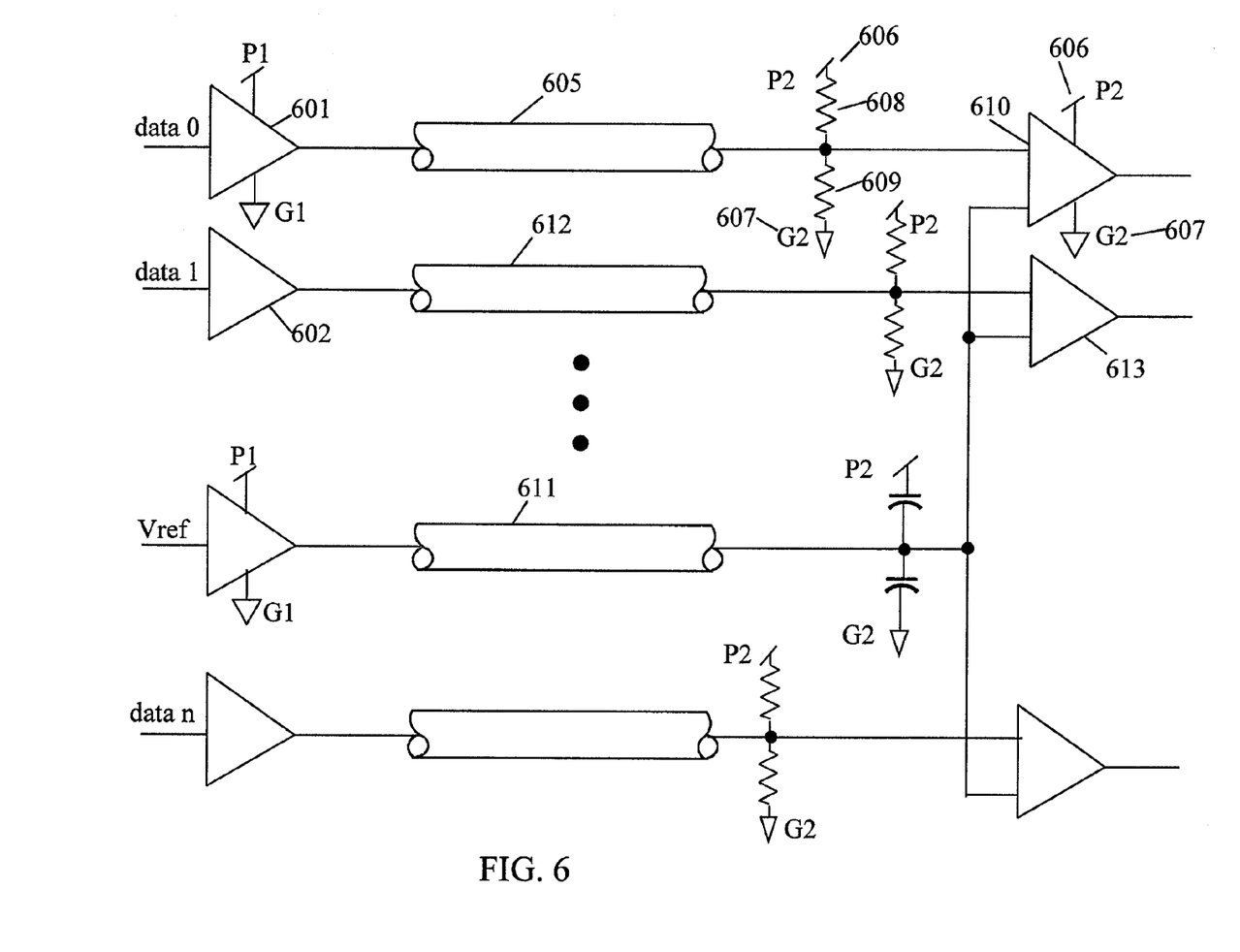
FIG. 6 illustrates a data eye pattern for a differential signal transmitted by a differential driver according to embodiments of the present invention and received at the inputs of a differential receiver.

Various signal characteristics may be monitored in determining what metric to use in setting an optimum value of variables affecting an eye pattern 600. FIG. 6 illustrates a superposition of many received signals (e.g., difference signal between nodes 456 and 457) of transmission lines (TL) (e.g., TL 450 and 451). FIG. 6 defines what is meant by the "eye window" of a waveform as discussed in embodiments of the present invention. If one alternates between sending a repetitive signal and its complement, then a time lapse oscillograph of received waveforms would show that the waveform transitions between a logic one and a logic zero actually vary (e.g., positive transitions 607 and negative transitions 610). The actual voltage levels corresponding to a logic one (609) and a logic zero (608) also show dynamic variances. The voltage value of the "eye window" is illustrated by arrow 606 between voltage levels 601 and 602 and the time value is illustrated by arrows 612 and 613 between the transitions above voltage levels 601 and 602. Voltage level 601 illustrates the voltage above where a received signal is defined as a logic one and level 602 illustrates the voltage below where a received signal is defined as a logic zero. The crossover point 611 (voltage 550 mV) may be an ideal threshold voltage for a receiver detecting waveforms 600. The voltage between 601 and 611 may be called the positive signal-to-noise margin and the voltage between 611 and 602 may be called the negative signal-to-noise margin. Noise margins may be one way to determine an optimum value to use to set a reference voltage (e.g., Vref 241) for detecting a differential signal generated at a differential receiver output (e.g., 460).

If the data 600 was sampled by a clock transition 609, it would be ideal to have the clock transition occur at time 605 where the guardband times 612 and 613 from the ideal point to the data transitions are equal and maximum. If the clock 609 sample point 605 moved to the left more than guardband 612, then errors may occur. Likewise, if the clock sample point 605 moved right more than guardband 613, then errors may occur. Using this criteria, it can be said that positioning data 600 relative to clock 609 as shown would have maximized the eye pattern window for detecting the logic states of data 600. If the clock generating clock edge 609 was asymmetrical or had timing jitter, then the effective eye window size would be diminished by the clock asymmetry and the jitter.

Although the present invention and its advantages have been described in detail, it should be understood that various changes, substitutions and alterations can be made herein without departing from the spirit and scope of the invention as defined by the appended claims.

What is claimed is:

1. A driver circuit for transmitting a differential logic signal over transmission lines comprising:
a differential circuit having a first input coupled to a first data signal, a second input coupled to a second data signal, a first driver output with a first source resistance coupled to an input of a first transmission line and generating a first output signal, and a second driver output with a second source resistance coupled to an input of a second transmission line and generating a second output signal, wherein the first output signal is a difference between the first and second data signals amplified with a compensated gain, and the second output signal is a complement of the first output signal;
a driver compensation network coupled to the differential circuit for setting the compensated gain to have a maximum gain value for frequencies greater than a first frequency, attenuating the maximum gain value of the differential circuit to a minimum gain value at frequencies below a second frequency substantially lower than the first frequency, and setting the compensated gain of the amplifier to transition between the minimum and maximum gain values at frequencies between the first and second frequencies, wherein a differential receiver comprises a receiver compensation network for setting the receiver gain of the differential receiver at a maximum gain value for frequencies greater than a first frequency, attenuating the maximum gain value to a minimum value at frequencies below a second frequency substantially lower than the first frequency, and setting the receiver gain to transition between the minimum and maximum values at frequencies between the first and second frequencies; and
wherein an output of the first transmission line is coupled to a first receiver input of the differential receiver, an output of the second transmission line is coupled to a second receiver input of the differential receiver, and a differential termination resistance is coupled between the outputs of the first and second transmission lines, the differential receiver generating a detected signal at a receiver output as the difference between a received first signal at the first receiver input and a received second signal at the second receiver input amplified by a receiver gain.

2. The driver circuit of claim 1, wherein the driver compensation network comprises a resistor coupled in parallel with a capacitor forming a first compensation node coupled to the first bias terminal of the first current source and forming a second compensation node coupled to the second bias terminal of the second current source.

* * * * *